US009318554B2

(12) United States Patent
Sugiura et al.

(10) Patent No.: US 9,318,554 B2
(45) Date of Patent: Apr. 19, 2016

(54) GATE PAD AND GATE FEED BREAKDOWN VOLTAGE ENHANCEMENT

(71) Applicant: Michael W. Shore, Dallas, TX (US)

(72) Inventors: Kenji Sugiura, Kanagawa-ken (JP); Takeshi Ishiguro, Fukushima-ken (KP)

(73) Assignee: Michael Wayne Shore, Dallas, TX (US)

( * ) Notice: Subject to any disclaimer, the term of this patent is extended or adjusted under 35 U.S.C. 154(b) by 0 days.

(21) Appl. No.: 14/209,643

(22) Filed: Mar. 13, 2014

(65) Prior Publication Data

US 2014/0264619 A1 Sep. 18, 2014

Related U.S. Application Data

(60) Provisional application No. 61/778,908, filed on Mar. 13, 2013.

(51) Int. Cl.
| H01L 29/06 | (2006.01) |
| H01L 27/088 | (2006.01) |
| H01L 29/423 | (2006.01) |
| H01L 29/78 | (2006.01) |
| H01L 29/10 | (2006.01) |

(52) U.S. Cl.
CPC ........ *H01L 29/0696* (2013.01); *H01L 29/0634* (2013.01); *H01L 29/0653* (2013.01); *H01L 29/42372* (2013.01); *H01L 29/7811* (2013.01); *H01L 29/1095* (2013.01)

(58) Field of Classification Search
CPC ............ H01L 29/0653; H01L 29/0696; H01L 27/088; H01L 29/0634; H01L 29/0878; H01L 21/823487; H01L 27/0814; H01L 29/66704; H01L 29/7823
See application file for complete search history.

(56) References Cited

U.S. PATENT DOCUMENTS

| 6,452,230 | B1 * | 9/2002 | Boden, Jr. ...................... 257/341 |
| 2002/0063259 | A1 * | 5/2002 | Usui et al. ..................... 257/110 |
| 2002/0070418 | A1 * | 6/2002 | Kinzer et al. ................. 257/496 |
| 2003/0006453 | A1 * | 1/2003 | Liang et al. ................... 257/328 |
| 2004/0043565 | A1 * | 3/2004 | Yamaguchi et al. .......... 438/268 |
| 2005/0250257 | A1 * | 11/2005 | Hossain et al. ............... 438/135 |
| 2006/0065923 | A1 * | 3/2006 | Pfirsch ......................... 257/328 |
| 2006/0197152 | A1 * | 9/2006 | Tokano et al. ................. 257/341 |
| 2006/0226494 | A1 * | 10/2006 | Hshieh .......................... 257/369 |
| 2008/0185643 | A1 * | 8/2008 | Hossain ......................... 257/342 |
| 2008/0258226 | A1 * | 10/2008 | Ishiguro ........................ 257/368 |
| 2010/0327350 | A1 * | 12/2010 | Loechelt et al. .............. 257/341 |
| 2013/0299900 | A1 * | 11/2013 | Anderson et al. ............. 257/330 |
| 2014/0264582 | A1 * | 9/2014 | Anderson et al. ............. 257/339 |
| 2014/0264619 | A1 * | 9/2014 | Sugiura et al. ................ 257/368 |

* cited by examiner

*Primary Examiner* — Jarett Stark
*Assistant Examiner* — Bitew Dinke
(74) *Attorney, Agent, or Firm* — Panitch Schwarze Bellisario & Nadel LLP

(57) ABSTRACT

A semiconductor chip includes a semiconductor layer having first and second opposing main surfaces. A plurality of MOS-FET cells are at least partially formed in the semiconductor layer. A gate pad region is at least partially formed in the semiconductor layer and includes a gate pad contact and a first plurality of trenches extending from the first main surface. The first plurality of trenches are spaced apart from one another in a direction parallel to the first main surface by about 45 micrometers to about 60 micrometers. At least one gate feed region is at least partially formed in the semiconductor layer and includes a gate feed contact and a second plurality of trenches extending from the first main surface. The second plurality of trenches are spaced apart from one another in the direction parallel to the first main surface by about 45 micrometers to about 60 micrometers.

10 Claims, 8 Drawing Sheets

US 9,318,554 B2

GATE PAD AND GATE FEED BREAKDOWN VOLTAGE ENHANCEMENT

CROSS-REFERENCE TO RELATED APPLICATIONS

This application claims the benefit of U.S. Provisional Patent Application No. 61/778,908, filed on Mar. 13, 2013, entitled "Gate Pad and Gate Feed Breakdown Voltage Enhancement," the entire contents of which are incorporated by reference herein.

BACKGROUND OF THE INVENTION

Embodiments of the present invention relate generally to semiconductor devices, and more particularly, to semiconductor chips having superjunction cells and supporting higher breakdown voltages.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Superjunction devices, including, but not limited to metal-oxide-semiconductor field-effect transistors (MOSFET), diodes, and insulated-gate bipolar transistors (IGBT), have been or will be employed in various applications such as automobile electrical systems, power supplies, and power management applications. For example, superjunction devices may specifically be employed in light emitting diode (LED) televisions, electric or hybrid cars, LED light bulbs, servers, tablets, uninterruptable power supplies (UPS), and the like. Such devices sustain high voltages in the off-state and yield low voltages and high saturation current densities in the on-state.

FIG. 1A is a schematic top plan view of a semiconductor chip 10 having a MOSFET region 12, a gate pad region 14, and a number of gate feed regions 16 as are conventionally known. In one commercial embodiment of the chip 10, the breakdown voltage of the chip 10 is about 685 Volts (V). FIG. 1B is a schematic top plan view of a first test chip 11A, which like the main chip 10, includes a MOSFET region 12 and a gate pad region 14. However, the gate feed regions 16 have been removed from the first test chip 11A. The breakdown voltage of the first test chip is slightly higher than 685 V. In FIG. 1C, a second test chip 11B is shown with both the gate feed regions 16 and the gate pad region 14 removed. The breakdown voltage of the second test chip 11B is about 708 V.

This demonstrates that the breakdown voltage of a chip is limited by the component having the lowest breakdown voltage. In this case, the breakdown voltages of gate feed regions 16 are lower than that of the gate pad region 14, which is lower than that of the MOSFET region 12. In fact, the breakdown voltages of the main chip 10 and the first test chip 11A are always lower than the second test chip 11B by about 10-40 V.

FIG. 2 is an enlarged partial cross-sectional view of a prior art chip 10 proximate a gate feed region 16. The gate feed region 16 includes a plurality of trenches 20A, 20B formed in a semiconductor layer 22 and spaced apart from each other by about 15 micrometers (μm). First columns 24 of a first conductivity type (typically p-type) are formed extending along and adjacent to sidewalls of each of the plurality of trenches 20A, 20B. A second column 26 of a second conductivity type opposite to the first conductivity type (e.g., n-type) is disposed between respective first columns 24 bordering adjacent trenches 20A, 20B. In FIG. 2, the outer-most trenches 20A separate the gate feed region 16 from MOSFET cells 19 located in the MOSFET region 12. Thus, in this cross-sectional view, the gate feed region 16 includes at least four trenches 20A, 20B.

A deep doped region 28 of the first conductivity type extends between the two inner-most trenches 20B beneath the gate feed 30. A thick layer of oxide 32 separates the deep doped region 28 from the gate feed 30, which is coupled to a metal contact 34. Channel regions 36 of the first conductivity type are disposed above the first and second columns 24, 26 between the inner-most trenches 20B and outer-most trenches 20A. Each channel 36 includes a body contact region 38 coupled to a metal source contact 40 that connects the body contact region 38 to an adjacent MOSFET cell 19.

FIG. 3 is an enlarged partial cross-sectional view of a prior art chip 10 proximate a gate pad region 14. The structure shown in FIG. 3 is similar to that of FIG. 2. However, there are more than two "inner" trenches 20B (all spaced apart from each other by about 15 μm) disposed in the semiconductor layer 22 between the outer-most trenches 20A separating the MOSFET region 12 from the gate pad region 14. As a result, a plurality of deep doped regions 28 are present, each located beneath a respective one of a plurality of pad regions 50 and separated from the deep doped regions 28 by a thick layer of oxide 32. The pad regions 50 are all electrically connected to a gate pad contact 54.

It is desirable to equalize the breakdown voltages of the gate feed regions 16 and gate pad region 14 with the breakdown voltage of the MOSFET region 12 in order to achieve maximum capabilities from the chip 10.

BRIEF SUMMARY OF THE INVENTION

Briefly stated, an embodiment of the present invention comprises a semiconductor device including a semiconductor layer having first and second opposing main surfaces. A first trench and a second trench each extend from the first main surface of the semiconductor layer and have a first sidewall and a second sidewall. First columns of a first conductivity type each respectively extend along the first sidewall of the first trench and the second sidewall of the second trench, and a second column of a second conductivity type is disposed between and adjacent the first columns. The second conductivity type is opposite to the first conductivity type. A first channel of the first conductivity type extends from the first sidewall of the first trench along the first main surface. A second channel of the first conductivity type extends from the second sidewall of the second trench along the first main surface. A doped region of the first conductivity type is disposed between the first and second trenches and extends from the first main surface. A gate feed is disposed proximate the doped region and is separated therefrom by a layer of oxide formed on the first main surface. The gate feed has a longitudinal axis extending in a direction parallel to the first main surface and parallel to the first and second trenches. A first MOSFET cell is at least partially formed in the semiconductor layer proximate the second sidewall of the first trench and a second MOSFET cell at least partially formed in the semiconductor layer proximate the first sidewall of the second trench. The first and second trenches are separated in a direction parallel to the first main surface and perpendicular to the longitudinal axis of the gate feed by about 45 micrometers to about 60 micrometers.

Another preferred embodiment comprises a semiconductor device including a semiconductor layer having first and second opposing main surfaces. A first boundary trench and a second boundary trench each extend from the first main surface of the semiconductor layer. A gate pad contact is disposed proximate the first main surface and defines a length direction and a width direction orthogonal to the length direction. The length and width directions are parallel to the first main surface. A plurality of pad trenches each extend from the first main surface and are disposed between the first and second boundary trenches in a direction parallel to one of the length direction or width direction defined by the gate pad contact. Adjacent ones of the first boundary trench, the second boundary trench, and the plurality of pad trenches in the direction parallel to the length or width direction defined by the gate pad are separated by about 45 micrometers to about 60 micrometers. A plurality of first columns of a first conductivity type each extend along a respective sidewall of one of the first boundary trench, the second boundary trench, and the plurality of pad trenches. A plurality of second columns of a second conductivity type are each disposed between and adjacent to respective ones of the plurality of first columns located between adjacent ones of the first boundary trench, the second boundary trench, and the plurality of pad trenches. The second conductivity type is opposite to the first conductivity type. A plurality of channels of the first conductivity type each extend along the first main surface from the sidewall of a respective one of the first boundary trench, the second boundary trench, or the plurality of pad trenches. A plurality of doped regions of the first conductivity type each extend from the first main surface and are disposed between adjacent ones of the first boundary trench, the second boundary trench, and the plurality of pad trenches. A plurality of pad regions are each disposed proximate respective ones of the plurality of doped regions and are separated therefrom by a layer of oxide formed on the first main surface. Each of the plurality of gate pad regions is electrically connected to the gate pad. A first MOSFET cell is at least partially formed in the semiconductor layer proximate the first boundary trench and a second MOSFET cell is at least partially formed in the semiconductor layer proximate the second boundary trench.

Yet another preferred embodiment comprises a semiconductor chip including a semiconductor layer having first and second opposing main surfaces. A plurality of MOSFET cells are at least partially formed in the semiconductor layer. A gate pad region is at least partially formed in the semiconductor layer and includes a gate pad contact and a first plurality of trenches extending from the first main surface. The first plurality of trenches are spaced apart from one another in a direction parallel to the first main surface by about 45 micrometers to about 60 micrometers. At least one gate feed region is at least partially formed in the semiconductor layer and includes a gate feed contact and a second plurality of trenches extending from the first main surface. The second plurality of trenches are spaced apart from one another in the direction parallel to the first main surface by about 45 micrometers to about 60 micrometers.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

DETAILED DESCRIPTION OF THE INVENTION

Figure 1A:
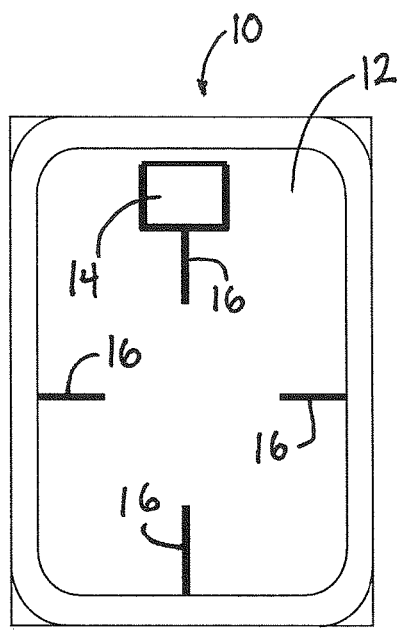
FIG. 1A is a schematic top plan view of a conventional semiconductor chip.
Figure 1B:
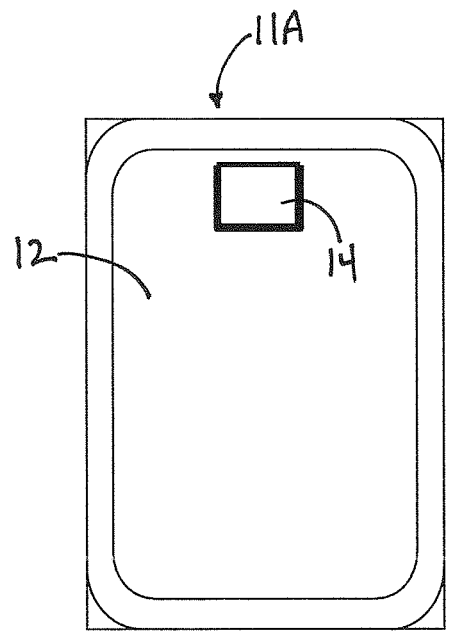
FIG. 1B is a schematic top plan view of a conventional semiconductor chip wherein the gate feed region is removed.
Figure 1C:
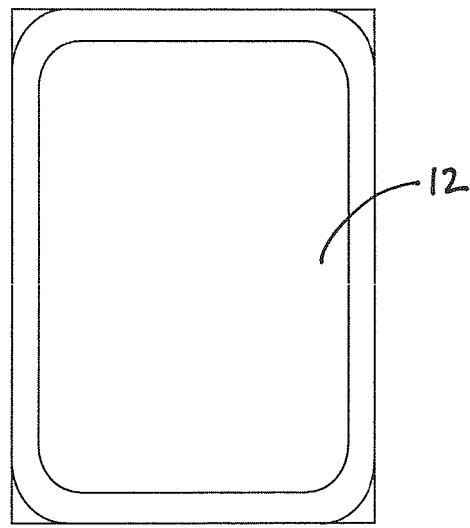
FIG. 1C is a schematic top plan view of a conventional semiconductor chip wherein the gate feed and gate pad regions are removed.
Figure 2:
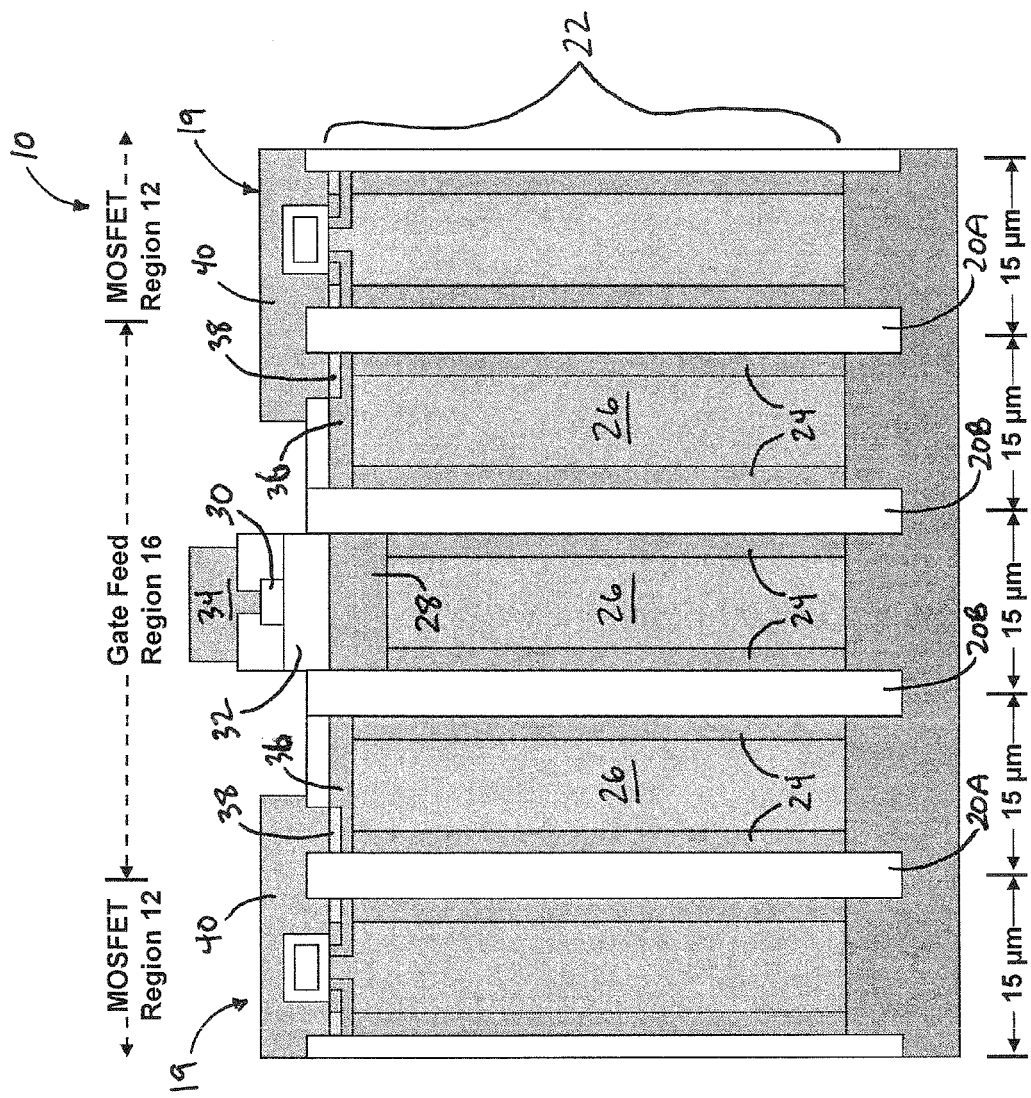
FIG. 2 is an enlarged partial cross-sectional view of a prior art chip proximate a gate feed region.
Figure 3:
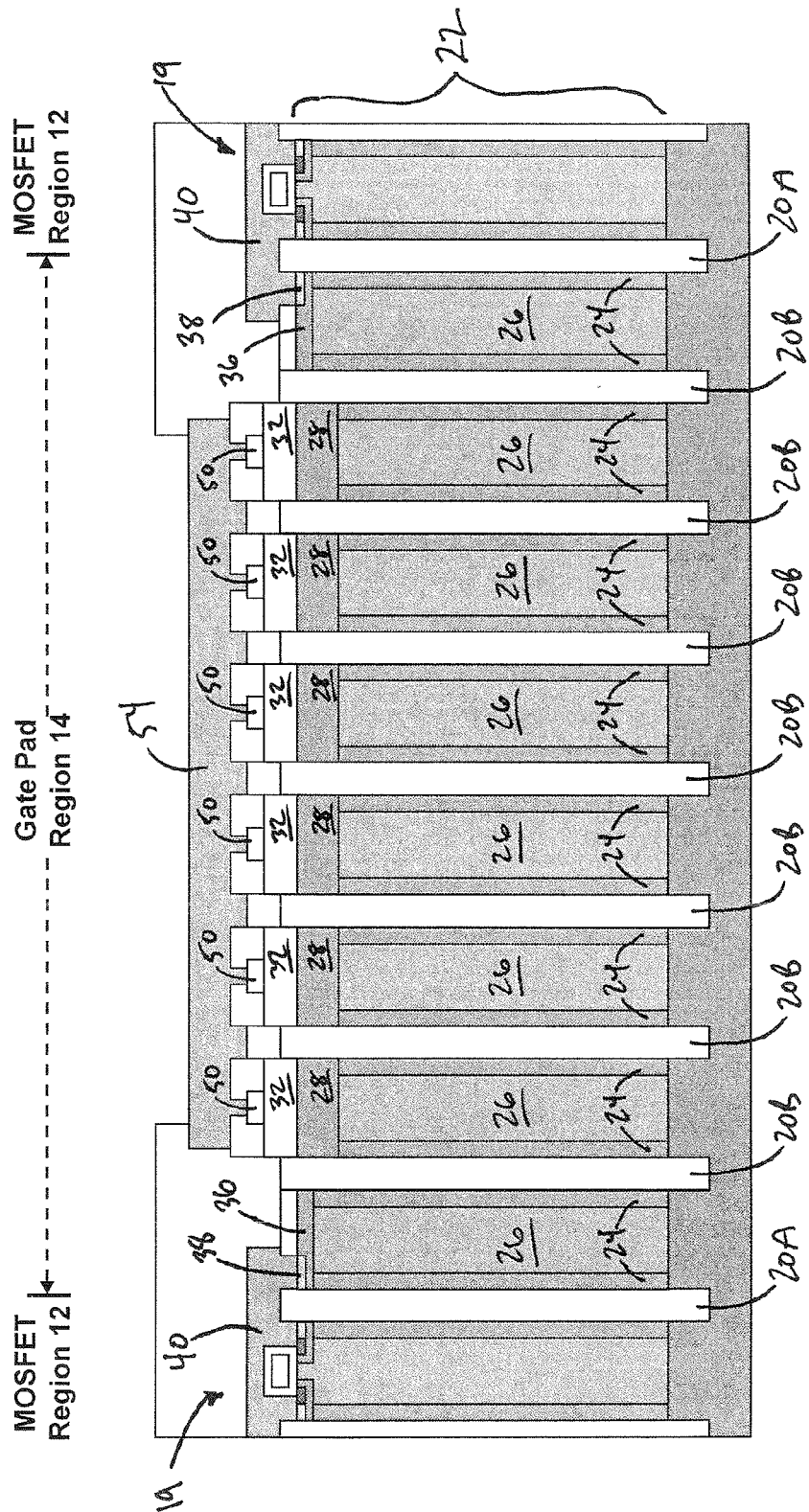
FIG. 3 is an enlarged partial cross-sectional view of a prior art chip proximate a gate pad region.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the semiconductor device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 4:
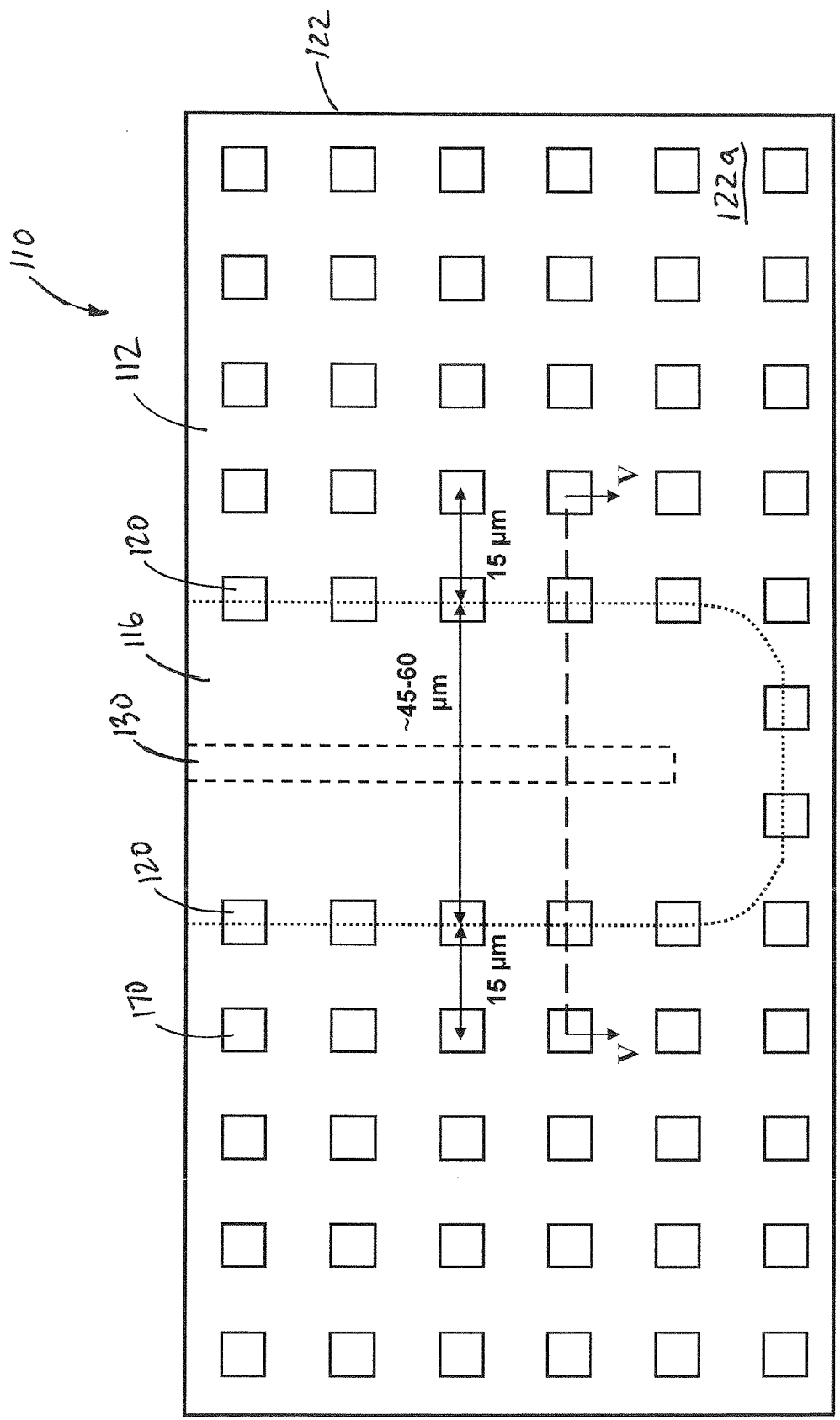
FIG. 4 is an enlarged partial top plan view of a semiconductor chip in accordance with a first preferred embodiment of the present invention.
Figure 5:
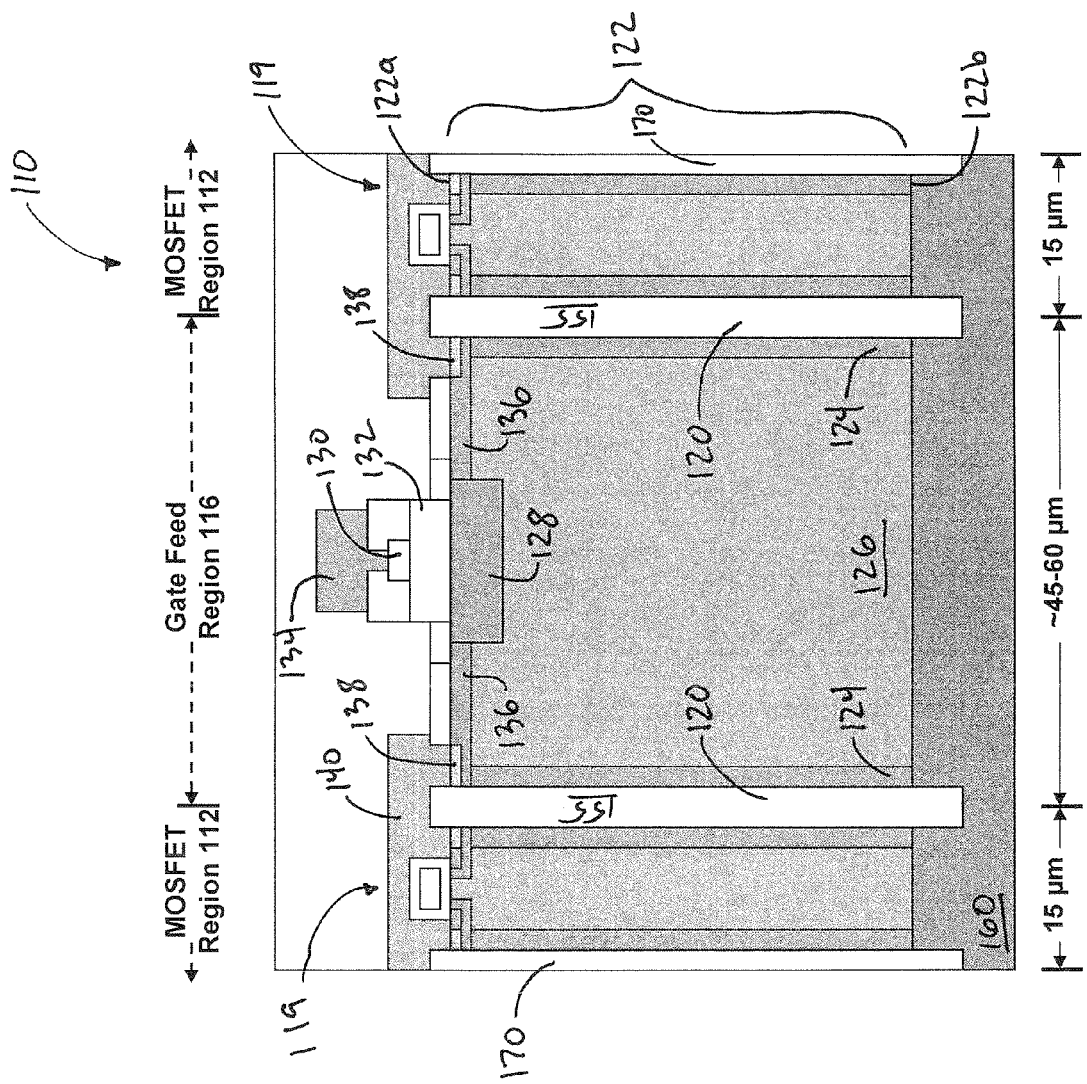
FIG. 5 is an enlarged partial elevational view of a cross-section of the chip of FIG. 4 taken along line V-V.

Referring to the drawings in detail, wherein like reference numerals indicate like elements throughout, there is shown in FIG. 4 an enlarged partial top plan view of a first main surface 122a of a semiconductor layer 122 of a semiconductor chip 110 proximate a gate feed region 116 and adjacent MOSFET regions 112. FIG. 5 is an enlarged view of the cross-section taken along line V-V of FIG. 4. The semiconductor layer 122 is provided with an opposing second main surface 122b. The second main surface 122b of the semiconductor layer 122 is preferably disposed on a semiconductor substrate 160, which is preferably formed of silicon (Si). But, the semiconductor substrate 160 may be formed of other materials such as gallium arsenide (GaAs), germanium (Ge) or the like. The substrate 160 preferably is of the heavily doped $n^+$ type.

In preferred embodiments, the semiconductor layer 122 is epitaxially grown on a surface of the semiconductor substrate 160, and is preferably a lightly doped $n^-$ silicon layer. The epitaxial growth or deposition may occur in a suitable reaction chamber at a temperature of up to about 1200° C. Other methods for forming the semiconductor layer 122 on the substrate 160, such as by bonding, annealing, and the like, may be used.

At least two trenches 120 extending from the first main surface 122a are formed in the semiconductor layer 122 at boundaries of the gate feed region 116 and the MOSFET regions 112. The trenches 120 are shown in FIG. 4 as having a square cross-section, but other shapes may be used, such as circles, ovals, rectangles, dog-bones, or the like. The trenches 120 are shown in FIG. 5 extending entirely through the semiconductor layer 122 and partially into the substrate 160. However, the depth of the trenches 120 is not so limited, and any desirable depth may be utilized in keeping with the spirit of the present invention.

The trenches 120 are preferably etched using deep reactive ion etching (DRIE). DRIE utilizes an ionized gas, or plasma, such as, for example, sulfur hexafluoride ($SF_6$), to remove material from the semiconductor layer 122. DRIE technology permits the formation of deeper trenches 120 with straighter sidewalls than other known techniques. Other techniques for forming the trenches 120 can be used, however, such as plasma etching, reactive ion etching (RIE), sputter etching, vapor phase etching, chemical etching, or the like.

A mask (not shown) is selectively applied over the first main surface 122a of the semiconductor layer 122. The mask may be created by deposition of a layer of photoresist or in some other manner well known to those skilled in the art. The developed photoresist is removed and undeveloped photoresist remains in place as is known in the art. For simplification, the mask refers to the material used to prevent certain areas of a semiconductor from being etched, doped, coated or the like. In certain embodiments, a thin layer of oxide or other dielectric material (not shown) may be applied to the first main surface 122a prior to application of the mask. The trenches 120 are formed in the areas not covered by the mask. After the trenching process, the mask is removed using techniques known in the art.

The sidewalls of each trench 120 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

First columns 124 of a first conductivity type (preferably p-type) extend along sidewalls of each of the trenches 120. The first columns 124 extend at least partially between the first and second main surfaces 122a, 122b of the semiconductor layer 122. A second column 126 of a second conductivity type (preferably n-type) is disposed between and adjacent to the first columns 124 in the gate feed region 116. Thus, a p-n-p (or n-p-n) column structure is formed, similar to that of MOSFET cells 119 in the chip 110.

The first and second columns 124, 126 may be formed by implantation of appropriate dopants, which may occur at predetermined angles. The implantation angles are determined by the width of the trenches 120 and the desired doping depth, and is typically from about 2° to 12° (−2° to −12°) from vertical. The implant is done at angles so that the bottom of each trench 120 is not implanted. Preferably, the implantation occurs at least partially between the first main surface 122a and the second main surface 122b of the semiconductor layer 122. The implant is performed at an energy level of about 30-200 kilo-electron-Volts (KeV) with dose ranges from about 1E13 to 1E14 $cm^{-2}$ (i.e., about 1×1013 to 1×1014 $cm^{-2}$). Typically, a dopant of the second conductivity type (e.g., n-type) is implanted into the sidewall surfaces of the trenches 120 to form n-type doped regions having a doping concentration lower than that of the heavily doped substrate 160. The doping preferably occurs with the aid of a mask (not shown) placed over the first main surface 122a of the semiconductor layer 122.

The doping is performed by one of ion implantation, solid diffusion, liquid diffusion, spin-on deposits, plasma doping, vapor phase doping, laser doping, or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping. Preferably, the doping is performed by ion implantation.

Following implanting, a drive in step at a temperature of up to 1200° Celsius may be performed for up to 12 hours. It should be recognized that the temperature and time are selected to sufficiently drive in the implanted dopant. But, the energy level used to perform ion implantation, as described above, may be high enough to sufficiently drive in the dopants without departing from the present invention.

Following implantation and driving of the n-type dopant, a similar doping step occurs with respect to the sidewalls of the trenches 120, but with a dopant of the opposite conductivity type (e.g., p-type). Drive-in of the two dopants may occur after each implantation step, or simultaneously. The result is the formation of the first and second columns 124, 126.

Within the gate feed region 116, channels 136 extend from respective sidewalls of the trenches 120 along the first main surface 122a of the semiconductor layer 122. The channels 136 are doped with a first conductivity (e.g., p-type), and can be formed before, during, or subsequent to formation of the first columns 124. The channels 136 may be formed by doping techniques described above, wherein the ion implantation takes place at the trench 120 sidewall and/or the first main surface 122a of the semiconductor layer 122 with appropriate masking, drive-in steps, and the like. A heavily doped body contact region 138 of the first conductivity type (e.g., $p^+$) is formed in each of the channels 136, preferably adjacent to the sidewall of the respective trenches 120. The body contact regions 138 may also be formed through ion implantation or other doping methods as are known.

A deep doped region 128 of the first conductivity type (e.g., p-type) is disposed between the trenches 120 and extends from the first main surface 122a of the semiconductor layer 122. The deep doped region 128 is electrically, and preferably physically, connected to the channels 136, and preferably extends to a greater depth within the semiconductor layer 122 than the channels 136. The deep doped region 128 can be formed by ion implantation or other doping methods as described above.

Above the deep doped region 128 is formed a gate feed 130. A thick layer of dielectric material 132 is preferably used to isolate the gate feed 130 from the deep doped region 128. The dielectric layer 132 may be formed on the first main surface 122a of the semiconductor layer 122 above the deep doped region 128 using known methods of dielectric deposition. The gate feed 130 may be composed of, for example, a metal, a doped polysilicon, an amorphous silicon, or a combination thereof, and formed by conventional techniques. As shown in phantom in FIG. 4, the gate feed 130 extends along the chip 10 such that its longitudinal axis extends in a direction parallel to the first main surface 122a of the semiconductor layer 122 and parallel to the trenches 120. A metal contact 134 is coupled to the gate feed 130.

The trenches are ultimately filled with an insulating or semi-insulating material 155. The refill is preferably performed after the requisite doping of the trench 120 sidewalls. In exemplary embodiments, the refill material 155 can be a polysilicon, a re-crystallized polysilicon, a single crystal silicon, Tetraethylorthosilicate (TEOS), or a semi-insulating polycrystalline silicon (SIPOS), filled into the trenches 120 using a spun-on-glass (SOG) technique. The trenches 120 may also be refilled using other techniques, such as low pressure (LP) chemical vapor deposition (CVD), or any other oxide deposition technique as is known in the art. The trenches 120 can be filled by a reflow process or the like.

The pitch of the trenches 120, i.e., the spacing between the trenches 120 in the gate feed region 116 in a direction parallel to the first main surface 122a of the semiconductor layer 122 and perpendicular to the longitudinal axis of the gate feed, is between about 45 µm and about 60 µm.

The MOSFET region 112 includes a plurality of MOSFET cells 119 at least partially formed in the semiconductor layer 122. Preferably, a MOSFET cell 119 is located proximate to each of the trenches 120. The MOSFET cells 119 are preferably formed and structured according to known techniques, which will not be repeated herein. The MOSFET cells 119 preferably each include MOSFET trenches 170, which may be similar to the trenches 120 in the gate feed region 116, and extend from the first main surface 122a of the semiconductor layer 122 and at least slightly into the substrate 160. Preferably, a metal source contact 140 electrically couples a body contact region 138 in the gate feed region 116 to an adjacent MOSFET cell 119.

The MOSFET trenches 170 are preferably spaced apart from one another, and from the trenches 120 in the gate feed region 116, in a direction parallel to the first main surface 122a of the semiconductor layer 122 and perpendicular to the longitudinal axis of the gate feed by about 15 µm. Thus, the pitch of the MOSFET trenches 170 remains the same, but the spacing between the trenches 120 in the gate feed region 116 is increased.

Figure 6:
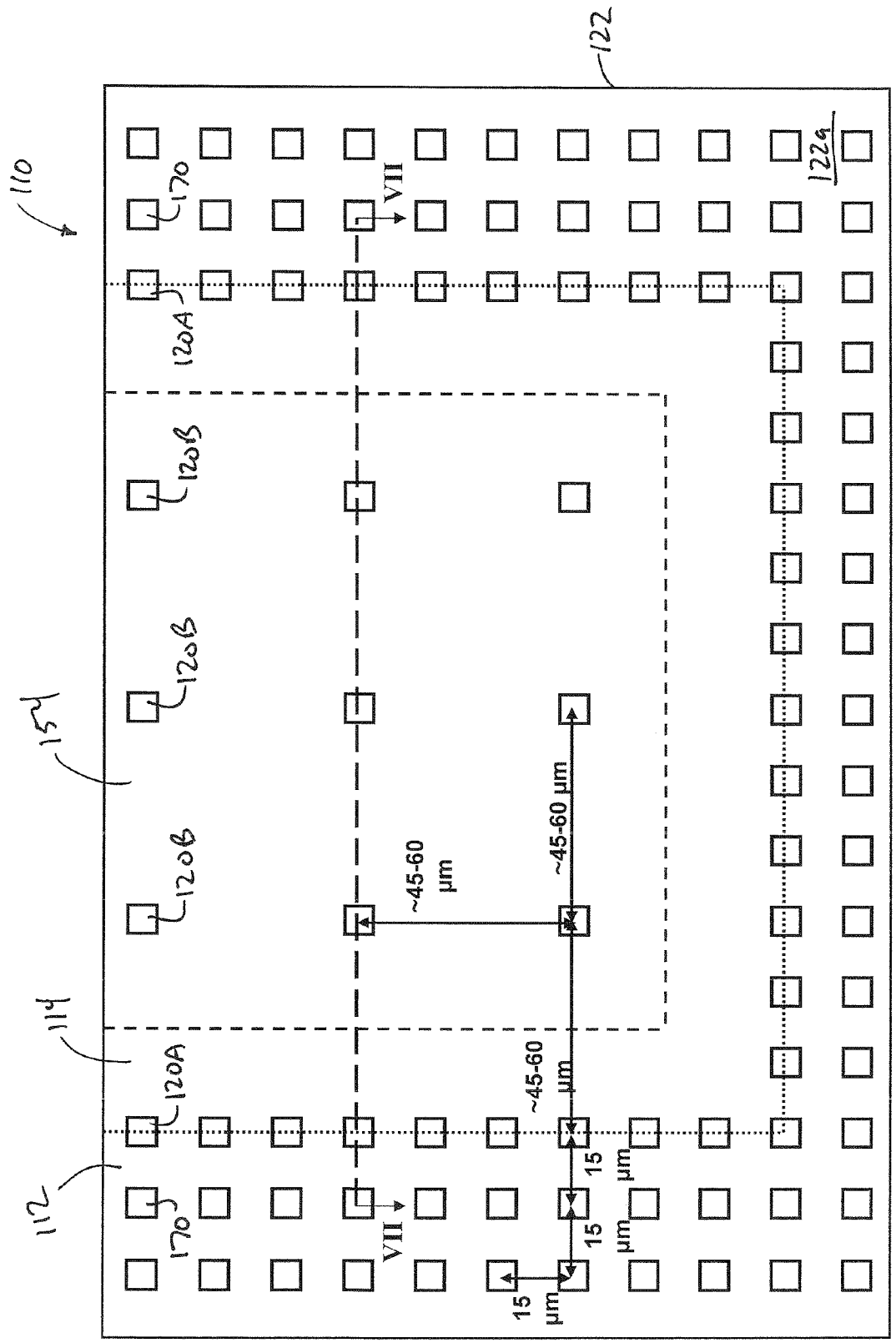
FIG. 6 is an enlarged partial top plan view of a semiconductor chip in accordance with a second preferred embodiment of the present invention.
Figure 7:
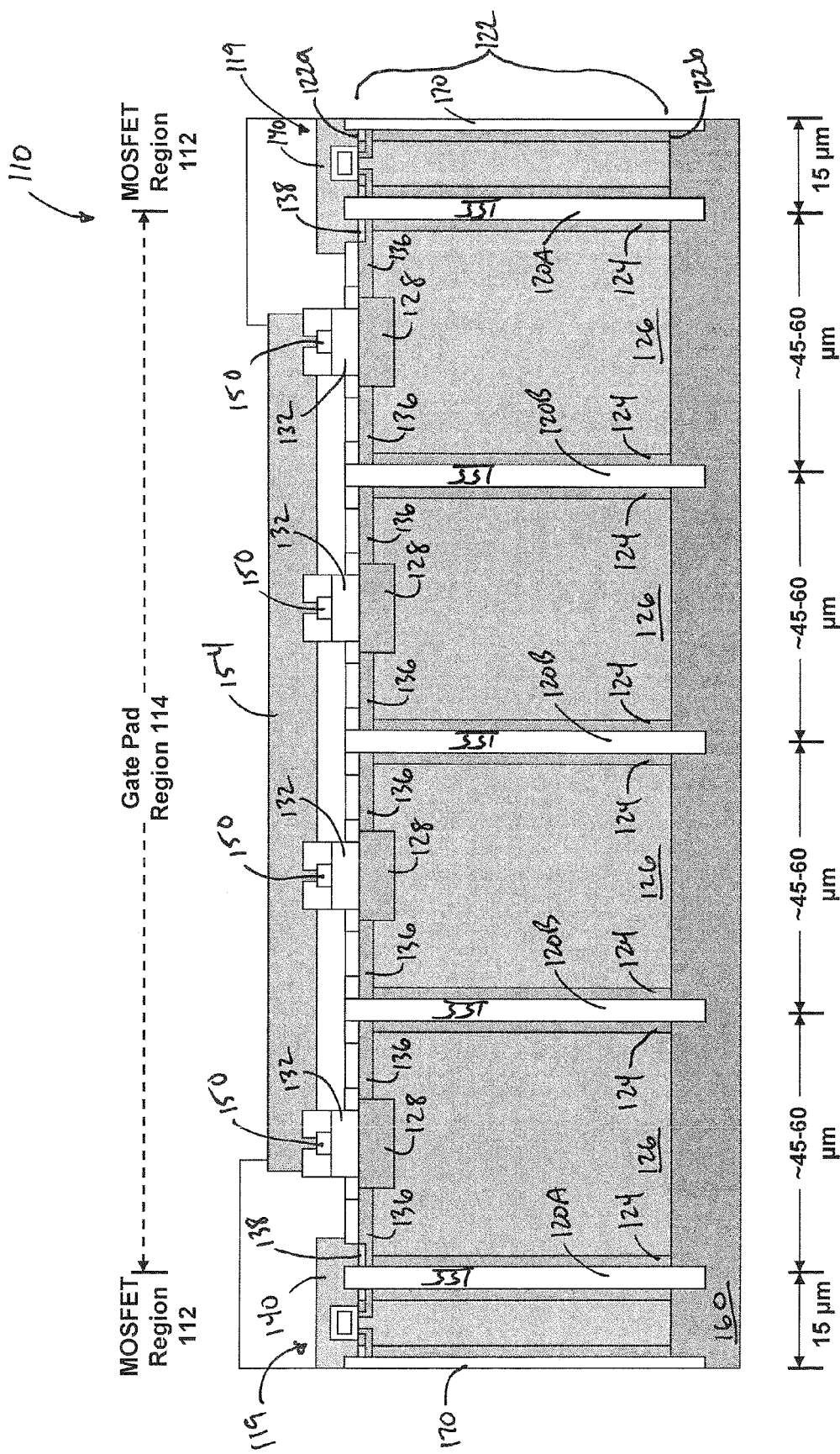
FIG. 7 is an enlarged partial elevational view of a cross-section of the chip of FIG. 6 taken along line VII-VII.

FIG. 6 is an enlarged partial top plan view of the first main surface 122a of the semiconductor layer 122 of the semiconductor chip 110 proximate a gate pad region 114 and adjacent MOSFET regions 112. FIG. 7 is an enlarged view of the cross-section taken along line VII-VII of FIG. 6. The structures shown in FIGS. 6 and 7 are similar to that of FIGS. 4 and 5, respectively. However, a gate pad contact 154 typically has a much broader surface area, defined by a length L and width W, than the gate feed 130. Thus, in addition to the "outer" boundary trenches 120A bordering on the MOSFET region 112, a plurality of "inner" pad trenches 120B are disposed between the boundary trenches 120A and beneath the gate pad contact 154.

Similar to the gate feed region 116 (FIG. 5), first columns 124 of the first conductivity type (preferably p-type) extend along sidewalls of each of the trenches 120A, 120B, and extend at least partially between the first and second main surfaces 122a, 122b of the semiconductor layer 122. Second columns 126 of the second conductivity type (preferably n-type) are disposed between and adjacent respective ones of the first columns 124 in the gate pad region 114. Thus, p-n-p (or n-p-n) column structures are formed between each of the adjacent trenches 120A, 120B.

Between each of the adjacent trenches 120A, 120B, pairs of channels 136 extend from respective sidewalls of the adjacent trenches 120A, 120B along the first main surface 122a of the semiconductor layer 122. However, the heavily doped body contact region 138 of the first conductivity type (e.g., $p^+$) is only formed in the channels 136 adjacent the boundary trenches 120A. Deep doped regions 128 of the first conductivity type (e.g., p-type) are disposed between each of the adjacent trenches 120A, 120B and each extends from the first main surface 122a of the semiconductor layer 122. As before, each deep doped region 128 is electrically, and preferably physically, connected to the respective channels 136, and preferably extends to a greater depth within the semiconductor layer 122 than the channels 136. Gate pads 150 are formed similar to the gate feed 130 (FIG. 5), and each is preferably separated from a respective deep doped region 128 by thick dielectric material 132. The gate pads 150 are all connected to a common gate pad contact 154.

The pitch of the trenches 120A, 120B, i.e., the spacing between adjacent ones of the trenches 120A, 120B in the gate pad region 114 in a direction parallel to the length L or width W defined by the gate pad contact 154, is between about 45 µm and about 60 µm. As before, the MOSFET trenches 170 are preferably spaced apart from one another, and from the boundary trenches 120A in the gate pad region 114, in directions parallel to the length L and width W defined by the gate pad contact 154, by about 15 µm. Thus, the pitch of the MOSFET trenches 170 remains the same, but the spacing between the trenches 120A, 120B in the gate pad region 114 is increased.

Figure 8:
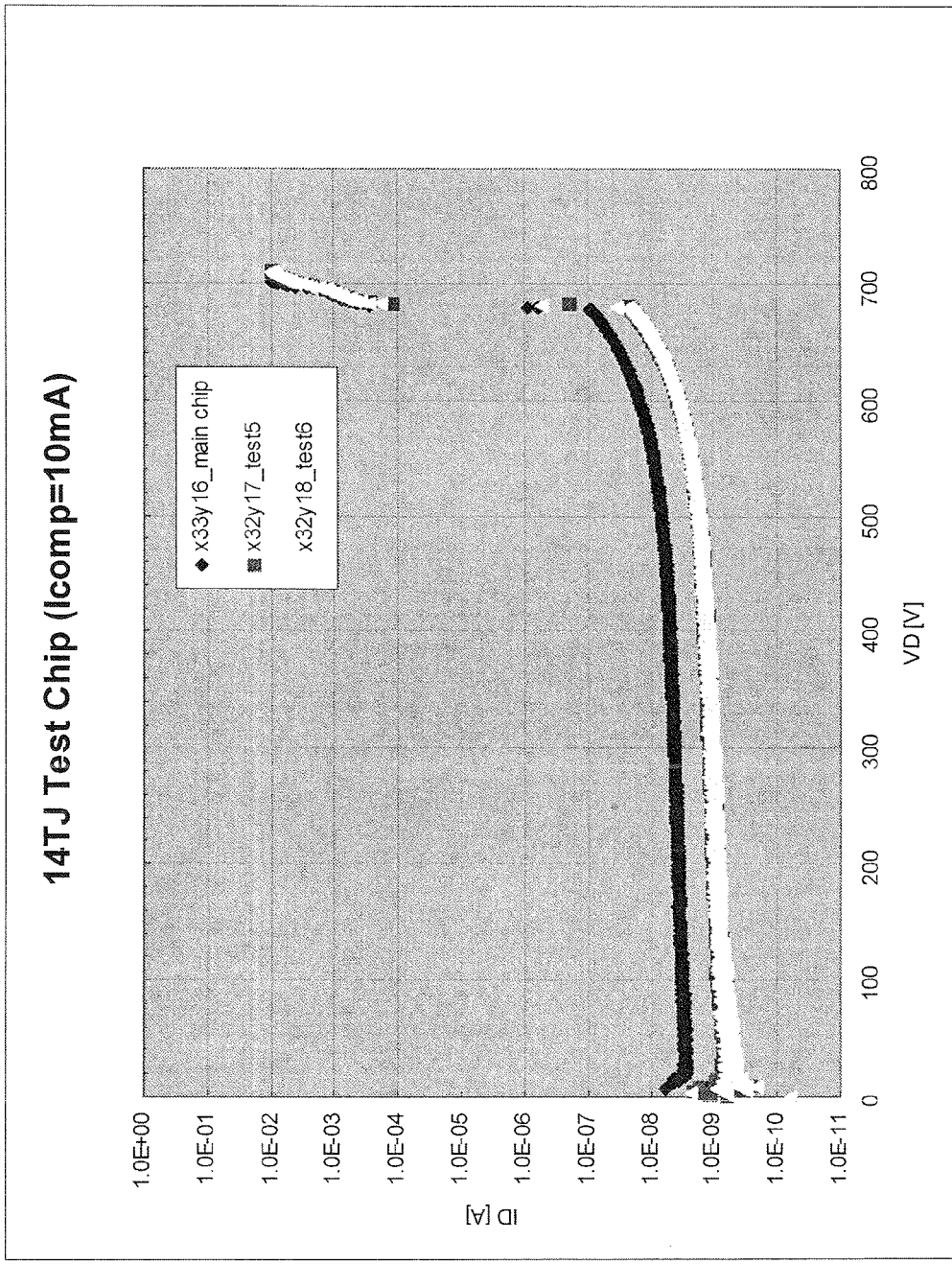
FIG. 8 is a graph showing breakdown voltages of various test chips in accordance with preferred embodiments of the present invention.

It has been found that by increasing the trench pitch beneath the gate pad and gate feed regions 114, 116 to between about 45 µm and about 60 µm, the breakdown voltages of the two regions can be increased to be about equal with the breakdown voltage of the main MOSFET cell region 112. This can be seen in the chart of FIG. 8, which shows that the breakdown voltages for a test chip with all three regions 112, 114, 116 (main chip), a test chip without the gate feed region 116 (test5), and a test chip without the gate pad region 114 and gate feed region 116 (test6) are all about equal. It has also been found that extending the trench pitch beyond 60 µm can have a detrimental effect on breakdown voltages. For example, a trench pitch of 90 µm may have an even lower breakdown voltage than regions with spacings at 15 µm.

Preferably, the precise trench pitch in the gate pad and gate feed regions is selected as a multiple of the trench pitch in the MOSFET region 112. This allows for a symmetrical trench configuration in the gate pad and gate feed regions 114, 116, and makes for a more uniform electric field. For example, in the drawings the MOSFET trench pitch is about 15 µm, so that the improved characteristics according to an embodiment of the invention are found at 3×15=45 µm and 4×15=60 µm. For a MOSFET region 112 with a smaller trench pitch, for example 9 µm, trenches in the gate pad and gate feed regions 114, 116 are preferably spaced apart at 5×9=45 µm or 6×9=54 µm. Similarly, a MOSFET region 112 with a trench pitch of 6 µm would preferably result in trench pitches of, for example, 8×6=48 µm or 10×6=60 µm, and the like. Of course, other trench spacings may be used without departing from the spirit of the invention.

Devices formed in accordance with the present invention can be used in, for example, automobile electrical systems, power supplies, and power management applications. For example, devices in accordance with the present invention can be employed in LED televisions or displays screens, electric or hybrid cars, LED light bulbs, servers, tablets, uninterruptable power supplies (UPS), and the like.

It will be appreciated by those skilled in the art that changes could be made to the embodiments described above without departing from the broad inventive concepts thereof. It is understood, therefore, that this invention is not limited to the particular embodiments disclosed, but it is intended to cover modifications within the spirit and scope of the present invention as defined by the appended claims.

We claim:

1. A semiconductor device comprising:
    a semiconductor layer having first and second opposing main surfaces;
    a first trench and a second trench, each of the first and second trenches extending from the first main surface of the semiconductor layer and having a first sidewall and a second sidewall;
    first columns of a first conductivity type, each first column respectively extending along the first sidewall of the first trench and the second sidewall of the second trench, and a second column of a second conductivity type is disposed between and adjacent the first columns, the second conductivity type being opposite to the first conductivity type;
    a first channel of the first conductivity type extending from the first sidewall of the first trench along the first main surface;
    a second channel of the first conductivity type extending from the second sidewall of the second trench along the first main surface;
    a doped region of the first conductivity type disposed between the first and second trenches and extending from the first main surface, wherein between the first and second trenches, the doped region is electrically connected to the first columns by the first and second channels;
    a gate feed disposed proximate the doped region and separated therefrom by a layer of oxide formed on the first main surface, the gate feed having a longitudinal axis extending in a direction parallel to the first main surface and parallel to the first and second trenches; and
    a first MOSFET cell at least partially formed in the semiconductor layer proximate the second sidewall of the first trench and a second MOSFET cell at least partially formed in the semiconductor layer proximate the first sidewall of the second trench,
    the first and second trenches being separated in a direction parallel to the first main surface and perpendicular to the longitudinal axis of the gate feed by about 45 micrometers to about 60 micrometers.

2. The semiconductor device of claim 1, further comprising a first body contact region of the first conductivity disposed within the first channel and a second body contact region of the first conductivity disposed within the second channel.

3. The semiconductor device of claim 2, further comprising a metal source contact coupled to one of the first or second body contact regions.

4. The semiconductor device of claim 3, wherein the metal source contact is coupled to one of the first and second MOSFET cells.

5. The semiconductor device of claim 2, wherein the first and second body contact regions have a doping concentration different than a doping concentration of the first and second channels.

6. The semiconductor device of claim 1, wherein the first MOSFET cell includes a third trench extending from the first main surface.

7. The semiconductor device of claim 6, wherein the first and third trenches are spaced apart in the direction parallel to the first main surface and perpendicular to the longitudinal axis of the gate feed by about 15 micrometers.

8. The semiconductor device of claim 6, wherein the second MOSFET cell includes a fourth trench extending from the first main surface.

9. The semiconductor device of claim 1, further comprising a semiconductor substrate of the second conductivity disposed on the second main surface.

10. The semiconductor device of claim 1, further comprising a metal contact coupled to the gate feed.

* * * * *